US006270101B1

(12) United States Patent
Hase

(10) Patent No.: US 6,270,101 B1
(45) Date of Patent: Aug. 7, 2001

(54) MOBILE STANDING DEVICE FOR USE IN REHABILITATION

(76) Inventor: Marec Hase, Karl-Friedrich-Str 88, D-44795 Bochum (DE)

( * ) Notice: Subject to any disclaimer, the term of this patent is extended or adjusted under 35 U.S.C. 154(b) by 0 days.

(21) Appl. No.: 09/554,810

(22) PCT Filed: Nov. 20, 1998

(86) PCT No.: PCT/EP98/07453

§ 371 Date: Jun. 27, 2000

§ 102(e) Date: Jun. 27, 2000

(87) PCT Pub. No.: WO99/26579

PCT Pub. Date: Jun. 3, 1999

(30) Foreign Application Priority Data

Nov. 21, 1997 (DE) ............................................ 297 20 658

(51) Int. Cl.[7] .................................................... G01R 23/02
(52) U.S. Cl. ........................................ 280/250; 280/250.1
(58) Field of Search ................................ 280/242.1, 250, 280/250.1, 304.1, 87.01, 87.041; 297/DIG. 10

(56) References Cited

U.S. PATENT DOCUMENTS

| | | | | |
|---|---|---|---|---|
| 1,268,836 | * | 6/1918 | Hagerty | 280/250 |
| 3,493,245 | | 2/1970 | Nabinger . | |
| 3,629,880 | * | 12/1971 | Van Rhyn | 280/250 |
| 4,380,343 | | 4/1983 | Lovell et al. . | |
| 4,732,402 | * | 3/1988 | Lambert | 280/250.1 |
| 4,809,997 | | 3/1989 | Owens . | |
| 5,484,151 | | 1/1996 | Tholkes . | |
| 5,489,258 | * | 2/1996 | Wohnsen et al. | 280/250.1 |
| 6,053,591 | * | 4/2000 | Poindexter et al. | 280/250.1 |

FOREIGN PATENT DOCUMENTS

| | | | | |
|---|---|---|---|---|
| 840 575 | | 6/1952 | (DE) . | |
| 3432630 | * | 9/1985 | (DE) | 280/250.1 |
| 0 773 009 | | 5/1997 | (EP) . | |

* cited by examiner

*Primary Examiner*—Daniel G. DePumpo
(74) *Attorney, Agent, or Firm*—Collard & Roe, P.C.

(57) ABSTRACT

The invention relates to a mobile standing device for use in rehabilitation. The running wheels of the device are drive-connected to driving handwheels by chain or belt drives. In order to reduce the risk of injury or accident with a standing device of this type, the chain or belt drives are arranged in such a way that they are enclosed, preferably inside the front frame tube of the standing device.

6 Claims, 3 Drawing Sheets

MOBILE STANDING DEVICE FOR USE IN REHABILITATION

The invention relates to a mobile standing device for use in rehabilitation, with a frame, a plurality of running wheels, a seat which can be folded up; adjustable knee cushions, a vertically adjustable chest cushion, a vertically adjustable therapy table, adjustable foot holders, and two handwheels which, for the purpose of moving the device, each are drive-connected with one of the running wheels via a chain or belt drive. A standing device with said features is known from U.S. Pat. No. 5,484,151.

A standing device is understood to be a device which helps disabled people not capable of standing (e.g. due to paraplegia, multiple sclerosis, muscular diseases, open back, skull-brain trauma etc.) to move into an upright standing position. If the device is designed as a mobile unit, it offers the user the additional possibility to move with the device while being in a standing position. With the help of the hand wheels and the chain or belt drives, the user himself can generate the torques for moving the device and transmit same to the running wheels.

For using the standing device, the user first sits down on the seat, fixes his feet on the foot holders, and supports the knees on the knee cushions. The seat is then folded up by manual or motor force depending on the model, so that the user is forced into the standing position. In said position, the user is supported from behind by the seat and from the front by the knee cushions and the chest cushion. By turning the handwheels the user can move himself and the standing device across the floor.

Such a mobile standing device poses the serious problem that the disabled user or his helper can get injured on the exposed chain or belt drives, for example if parts of the body or pieces of garment get caught in a chain or belt drive.

According to the state of the art (U.S. Pat. No. 3,493, 245), it is known in connection with a similar mobile device to cover its chain drives by cover plates, which are located on the outside on a voluminous frame rack that surrounds the chain drive and a separate steering column for a steerable support wheel. Said frame construction and its covering require extremely high constructional expenditure and, furthermore, much space that is lost for the mobility of the user of the device and for helpers.

Therefore, the problem of the invention is to simplify the standing device of the type specified above by reducing the structural volume and by providing at the same time for a protected arrangement of the belt or chain drive.

For solving said problem the invention proposed based on a standing device of the type specified above a front, approximately vertically extending frame tube, on which the chest cushion and the therapy table are vertically adjustably supported, and where the chain or belt drives are arranged in the interior space of said frame tube.

Said front frame tube simplifies the structure of the standing device in the front zone to the extent that it combines within itself a number of functions because said frame tube is at the same time the bearing carrier for the support of the vertically adjustable chest cushion and the vertically adjustable therapy table as well as protective space for accommodating the chain or belt drives. It is particularly shown by the exemplified embodiment shown in the drawing that the frame tube has an extraordinarily small structural volume in spite of its many functions, so that more space is available for the user and the operating personnel. Provision is made according to a preferred embodiment that holders made of flat material are arranged in the interior of the front frame tube for the vertically adjustable support of the chest cushion and the therapy table, said holders being simultaneously fixable by clamping against the front frame tube by means of one single clamping element. With said advantageous further development of the invention, the vertically adjustable support elements for the chest cushion and the therapy table are consequently arranged in the interior of the front frame tube as well, namely protected in the best possible way and without taking up any additional space.

The chain or belt drive can be usefully tensioned by eccentrics, in which the handwheel shaft is supported on the front frame tube. Such eccentric clamping devices have a particularly simple structure as well and do not require any additional space in the interior of the front frame tube.

Furthermore, the foot holders each are secured with vertical adjustment on the lower frame part of the standing device by means of an oblong-hole clamping connection. The angle of each foot holder is additionally adjustable by means of an oblong-hole clamping connection. It is possible in this way to fix the foot at the correct level and in the right angular position.

Finally, provision is made that the lower part of the frame consists of two metal sheet cuts arranged spaced from each other. The front wheel and rear wheel bearings, the foot holders, a seat holder and the lifting device are secured on said pieces of metal sheet. Owing to the use of the spaced-apart metal sheet cuts for the lower part of the frame, said area of the frame can be particularly well adapted to the given conditions because no parts of the frame have to be bent, and an adequately torsion-resistant and favorable structure of said part of the frame for connecting the various holding devices is nonetheless obtained.

An exemplified embodiment of the invention is explained in greater detail in the following with the help of the drawings, in which.

Figure 1:
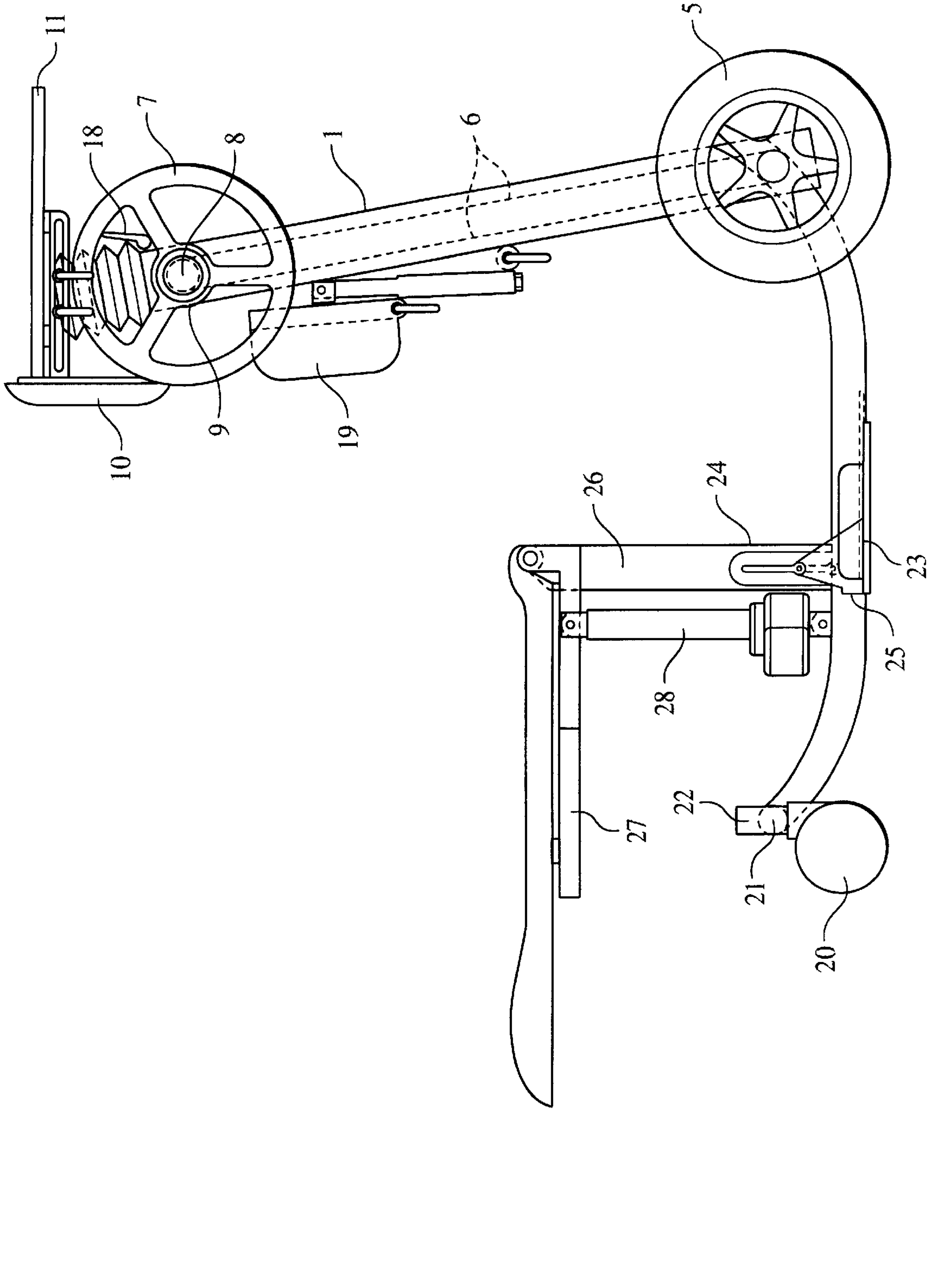
FIG. 1 shows a side view of a standing device as defined by the invention.
Figure 2:
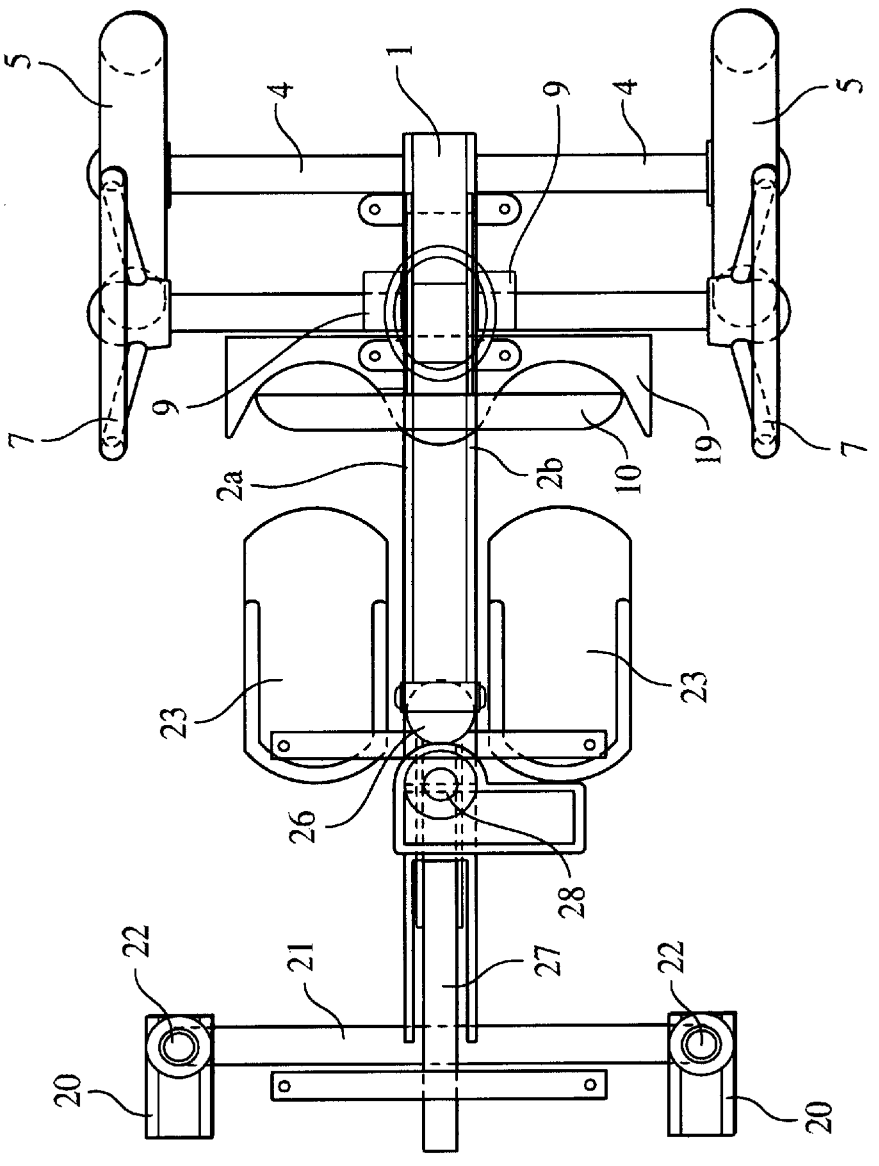
FIG. 2 shows a top view of the standing device with the seat and the therapy table removed.
Figure 3:
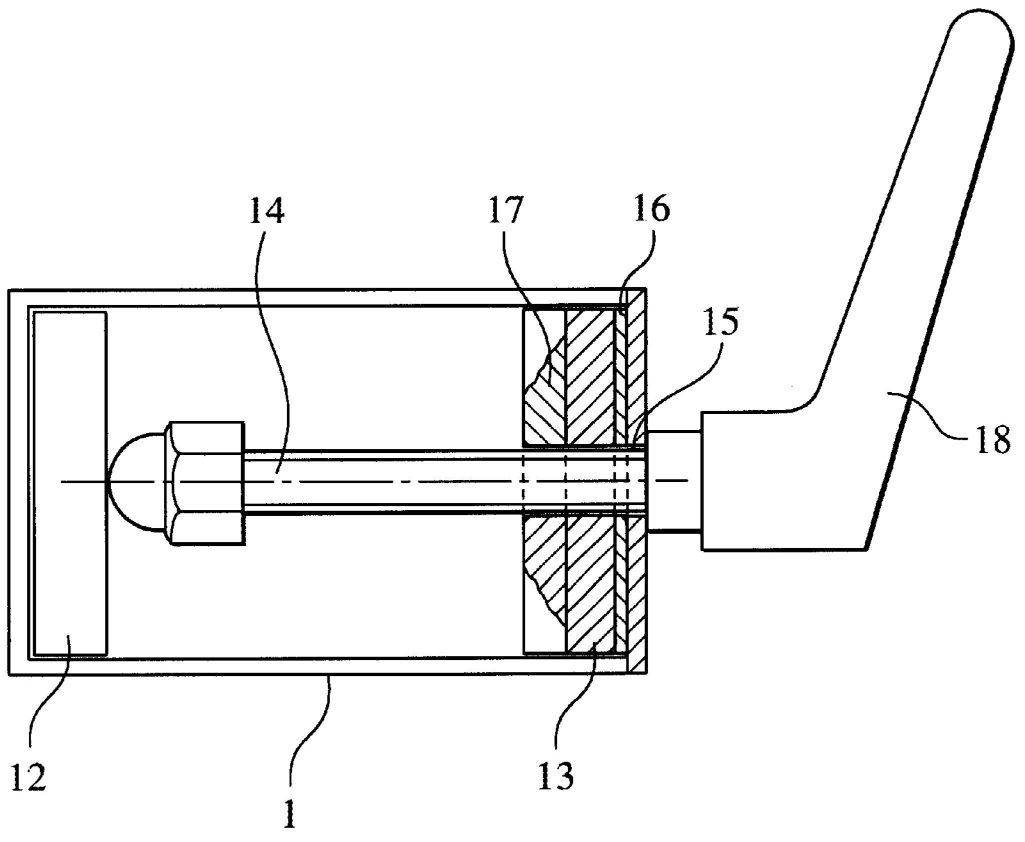

FIG. 3 schematically shows a section through the front frame tube (without the chain or belt drive).

The standing device shown in the drawing has an approximately vertically extending front frame tube 1 with a rectangular cross section. The lower end of the frame tube 1 is connected with a lower frame part 2 which consists of two metal sheet cuts 2*a* and 2*b* arranged spaced from each other. In the front, said metal sheet cuts have an area that is drawn up and connected with the front frame tube 1. On said front, drawn-up area of the lower frame part 2, two front running wheels 5 are supported by means of two bearing tubes 2. Said front running wheels each are driven via a chain or belt drive 6 arranged enclosed in the front frame tube 1 by a driving handwheel 7 supported on the top end of the front frame tube 1. The driving handwheels 7 each are located on the ends of the handwheel shafts 8, which each are supported on the top end of the front frame tube 1, with a rotatable eccentric 9 interconnected in each case. The chain or belt drives 6 can be tensioned by turning the eccentrics 9.

Furthermore, a vertically adjustable chest cushion 10 and an also vertically adjustable therapy table 11 are located at the top end of the front frame tube 1, said therapy table being located in front of the chest cushion 10. For fixing the chest cushion 10 and the therapy table 11 with vertical adjustability, said cushion and said table are provided with the holders 12 and 13 made of flat material. Said holders are inserted into the front frame tube 1 from the top and can be pressed by means of a clamping screw 14 from the inside against the side walls of the front frame tube 1 opposing each other (see FIG. 3). The clamping screw 14 penetrates the interior of the frame tube 1 through a bore 15 in the wall of the front frame tube 1, extends through an oblong hole 16 in the holder 13, and is screwed into a clamping plate 17, which is movably supported in the longitudinal direction of the clamping screw 14, but otherwise unrotationally supported in the front frame tube 1. The free end of the clamping screw 14 applies pressure to the oppositely disposed holder 12. When the clamping screw 14 is turned by means of a toggle 18, which is arranged on the outside, the free end of the clamping screw 14 forces the holder 12 against the opposite wall of the front frame tube 1, whereas the clamping plate 17 simultaneously presses the holder 13 against the opposite wall of the front frame tube 1. Therefore, it is advantageously possible by one single manipulation to fix the previously adjusted level of the chest cushion 10 and the therapy table 11 by actuating the clamping screw 14. The flat-material holders 12 and 13 require only little space in the interior of the front frame tube 1, so that the passage of the chains or belts of the chain or belt drives 6 through the holders 12 and 13 is not obstructed.

A knee cushion 19, which is vertically adjustable as well, is secured on the outside on the front frame tube 1 within its longitudinal zone.

The rear area of the lower frame part 2 is drawn up as well, whereby the other running wheels 20 are secured on the drawn-up end, with their suspension being reinforced by the rear wheel strutting 21. Said other running wheels 20, however, are not driven and are each pivot-mounted, swinging about the vertical axles 22, so that said wheels are capable of following any direction of movement of the standing device.

Two foot holders 23 are secured in the low-lying center zone of the lower frame part 2. Each of said foot holders is vertically adjustable by means of a vertical oblong-hole clamping screw device 24 and its angle can be adjusted by means of a horizontal oblong-hole clamping screw device 25.

Furthermore, a vertically upwardly extending seat holding device 26 is secured in the lower-lying center zone of the lower frame part 2, and a seat 27, which can be folded up, is mounted on the end of said seat holding device. For folding the seat 27 up and simultaneously setting the user up in the standing position, a lifting device 28 is arranged beneath the folding seat 27, said lifting device being supported on the lower frame part 2 as well. Said lifting device can be actuated either by hand or by a motor.

What is claimed is:

1. A mobile standing device for use in rehabilitation, comprising a frame (1, 2), a plurality of running wheels (5, 20), a seat (27) which can be folded up; adjustable knee cushions (19), a vertically adjustable chest cushion (10), a vertically adjustable therapy table (11), adjustable foot holders (23), and with two handwheels (7) which, for the purpose of moving the device, each is drive-connected with one of the running wheels (5) via a chain or belt drive (6), wherein paid frame comprises a front, approximately vertically extending frame tube (1), on which the chest cushion (10) and the therapy table (11) are vertically adjustably supported, and wherein the chain or belt drives (6) are arranged in an interior of said front frame tube.

2. The standing device according to claim 1 wherein the chain or belt drives (6) can be tensioned by eccentrics (9) in which the handwheel shafts (8) are supported on the front frame tube (1).

3. The standing device according to claim 1 wherein the foot holders (23) are secured with vertical displaceability on a lower part of said frame (2) of the standing device by means of an oblong-hole clamping connection (24).

4. The standing device according to claim 3, wherein the foot holders (23) each are angularly adjustable by means of an oblong-hole clamping screw device (25).

5. The standing device according to claim 1 wherein a the lower part (2) of the frame comprises two metal sheet cuts (2*a*, 2*b*) arranged spaced from each other, and that the front wheel bearing (4), the rear wheel bearing (21), the foot holders (23), a seat holder (26) and the lifting device (28) are secured on said metal sheet cuts.

6. The standing device according to claim 1, wherein holders (12, 13) made of flat material are arranged in the interior of the front frame tube (1) for the vertically adjustable support of the chest cushion (10) and the therapy table (11), said holders being simultaneously fixable by clamping against the inner sides of the front frame tube (1) by means of one single clamping element (14).

* * * * *

UNITED STATES PATENT AND TRADEMARK OFFICE

CERTIFICATE OF CORRECTION

PATENT NO. : 6,270,101 B1
DATED : August 7, 2001
INVENTOR(S) : Marec Hase

It is certified that error appears in the above-identified patent and that said Letters Patent is hereby corrected as shown below:

Column 4, claim 1,
Line 9, please change "paid" to -- said --.

Column 4, claim 5,
Line 1, after the word "a", please delete the word "the".

Signed and Sealed this

Sixteenth Day of April, 2002

Attest:

JAMES E. ROGAN
*Director of the United States Patent and Trademark Office*

*Attesting Officer*